(12) United States Patent
Bai et al.

(10) Patent No.: US 11,387,226 B2
(45) Date of Patent: Jul. 12, 2022

(54) CHIP POWER SUPPLY SYSTEM, CHIP, PCB, AND COMPUTER DEVICE

(71) Applicant: HUAWEI TECHNOLOGIES CO., LTD., Guangdong (CN)

(72) Inventors: Yadong Bai, Dongguan (CN); Zhijun Qu, Dongguan (CN); Changxing Sun, Nanjing (CN); Haitao Han, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/090,510

(22) Filed: Nov. 5, 2020

(65) Prior Publication Data
US 2021/0143141 A1 May 13, 2021

(30) Foreign Application Priority Data
Nov. 8, 2019 (CN) .......................... 201911088701.4

(51) Int. Cl.
*H05K 1/00* (2006.01)
*H01L 25/18* (2006.01)
(Continued)

(52) U.S. Cl.
CPC .......... *H01L 25/18* (2013.01); *H01L 23/3128* (2013.01); *H01L 24/14* (2013.01);
(Continued)

(58) Field of Classification Search
CPC ..... H01L 25/18; H01L 23/3128; H01L 24/14; H01L 24/16; H01L 2224/1413;
(Continued)

(56) References Cited

U.S. PATENT DOCUMENTS 6,845,013 B2 1/2005 Hartke et al.
6,947,293 B2 9/2005 DiBene, II et al.
(Continued)

FOREIGN PATENT DOCUMENTS

JP 2009232257 A 10/2009
JP 2012156184 A 8/2012
(Continued)

OTHER PUBLICATIONS

Sasao et al. (WO 2020/080526 A1 English Translation). (Year: 2019).*

*Primary Examiner* — Pete T Lee

(57) ABSTRACT

This application discloses a chip power supply system, a chip, a PCB, and a computer device. The chip power supply system includes a first printed circuit board (PCB), a chip, a power controller, and an inductor module. The first PCB includes N vias, first ends of the N vias are located at a top layer of the PCB, and second ends of the N vias are located at a bottom layer of the first PCB. The chip is coupled to the top layer of the first PCB through N power supply contacts and the first ends of the N vias. The inductor module is coupled to the chip through M power supply contacts and the second ends of M vias of the N vias. The power controller is coupled to the inductor module through the first PCB, and the power controller is configured to control the inductor module to supply power to the chip.

20 Claims, 14 Drawing Sheets

(51) Int. Cl.
*H01L 23/31* (2006.01)
*H01L 23/00* (2006.01)
*H05K 1/11* (2006.01)
*H05K 1/14* (2006.01)
*H05K 1/18* (2006.01)
*H01R 12/71* (2011.01)

(52) U.S. Cl.
CPC .............. *H01L 24/16* (2013.01); *H05K 1/115* (2013.01); *H05K 1/144* (2013.01); *H05K 1/181* (2013.01); *H01L 2224/1413* (2013.01); *H01L 2224/14135* (2013.01); *H01L 2224/14156* (2013.01); *H01L 2224/14177* (2013.01); *H01L 2224/16235* (2013.01); *H01R 12/714* (2013.01); *H05K 1/185* (2013.01); *H05K 2201/09609* (2013.01); *H05K 2201/1003* (2013.01); *H05K 2201/1006* (2013.01); *H05K 2201/10015* (2013.01); *H05K 2201/10189* (2013.01); *H05K 2201/10515* (2013.01); *H05K 2201/10545* (2013.01)

(58) Field of Classification Search
CPC . H01L 2224/14135; H01L 2224/14156; H01L 2224/14177; H01L 2224/16235; H05K 1/115; H05K 1/144; H05K 1/181; H05K 1/185; H05K 2201/09609; H05K 2201/10015; H05K 2201/1003; H05K 2201/1006; H05K 2201/10189; H05K 2201/10515; H05K 2201/10545; H01R 12/714

See application file for complete search history.

(56) References Cited

U.S. PATENT DOCUMENTS

| | | | |
|---|---|---|---|
| 7,378,733 | B1 | 5/2008 | Hoang et al. |
| 2001/0035746 | A1 | 11/2001 | Burstein et al. |
| 2011/0050334 | A1* | 3/2011 | Pan .......................... H01L 25/16 |
| | | | 327/564 |
| 2012/0139108 | A1 | 6/2012 | Kim et al. |
| 2016/0351504 | A1 | 12/2016 | Teshima et al. |
| 2018/0366423 | A1 | 12/2018 | Ong et al. |
| 2020/0075541 | A1* | 3/2020 | Sturcken ............... H02M 3/158 |
| 2020/0212018 | A1* | 7/2020 | Lai ......................... H01L 23/367 |
| 2020/0381344 | A1* | 12/2020 | Patil ........................ H01L 24/19 |
| 2021/0005576 | A1* | 1/2021 | Kim ......................... H01L 25/50 |

FOREIGN PATENT DOCUMENTS

| | | |
|---|---|---|
| JP | 5534566 B2 | 7/2014 |
| WO | 2010137379 A1 | 12/2010 |
| WO | 2016052221 A1 | 4/2016 |

\* cited by examiner

CHIP POWER SUPPLY SYSTEM, CHIP, PCB, AND COMPUTER DEVICE

CROSS-REFERENCE TO RELATED APPLICATION

This application claims priority to Chinese Patent Application No. 201911088701.4, filed on Nov. 8, 2019, which is hereby incorporated by reference in its entirety.

TECHNICAL FIELD

This application relates to chip technologies, and in particular to a chip power supply system, a chip, a printed circuit board (printed circuit board, PCB), and a computer device.

BACKGROUND

As the fifth-generation mobile communications technology ($5^{th}$ generation mobile network, 5G) and artificial intelligence (artificial intelligence, AI) applications develop, a network chip needs to provide more powerful switching and processing capabilities, and a central processing unit (central processing units, CPUs) and an AI chip also need to provide more powerful computing capabilities. As a result, these chips inevitably require larger currents during working.

How to provide a larger current for a working chip becomes a problem to be urgently resolved in this field.

SUMMARY

This application provides a chip power supply system, a chip, a PCB, and a computer device, so as to provide a larger current for the chip, thereby improving a signal processing capability and/or a computing capability of the computer device that uses the chip.

A first aspect of this application provides a chip power supply system. The chip power supply system includes a first printed circuit board PCB, a chip, a power controller, and an inductor module. The first PCB includes N vias, first ends of the N vias are located at a top layer of the first PCB, and second ends of the N vias are located at a bottom layer of the first PCB. A bottom surface of the chip is provided with N power supply contacts, and the chip is connected to the top layer of the first PCB through the N power supply contacts and the first ends of the N vias. A bottom surface of the inductor module is provided with M power supply contacts, and the inductor module is connected to the chip through the M power supply contacts and the second ends of M vias of the N vias. The power controller is connected to the inductor module through the first PCB, and controls the inductor module to supply power to the chip. Both N and M are natural numbers, and M is less than N.

According to the chip power supply system provided in this application, a power supply path of the chip can be shortened, greatly reducing energy consumption on the power supply path. In addition, according to the chip power supply system in this application, the inductor module does not need to supply power to the chip from a periphery of the chip (an area outside a coverage area of the chip) through the PCB, reducing a quantity of layers of the PCB and reducing production costs of the PCB. Further, because the inductor module transmits a voltage to the chip through the vias of the PCB, and the vias have the same length, impedance reaching all power contacts of the chip is basically the same, thereby resolving a problem of overcurrents at some power contacts of the chip.

In an implementation, the chip power supply system further includes an input capacitor and an output capacitor; the input capacitor is configured to filter an input voltage, and input the filtered input voltage into the inductor module; the output capacitor is configured to filter an output voltage, and input the filtered output voltage into the chip. Because the input capacitor can filter the input voltage and the output capacitor can filter an output voltage of the inductor module, a current finally transmitted to the chip is more stable.

In an implementation, the inductor module is connected to a bottom surface of the first PCB through the M power supply contacts and the second ends of the M vias of the N vias, and is connected to the chip through the M vias. In this implementation, the inductor module is directly connected to the chip through the M vias of the PCB, and therefore the chip power supply system may include only one PCB, thereby reducing manufacturing costs of the chip power supply system.

In an implementation, the inductor module includes an inductor and two MOS transistors to output a stable voltage and current. Optionally, the inductor module includes a plurality of submodules, and each submodule includes an inductor and two MOS transistors. The inductor module that integrates the plurality of submodules can provide a larger current.

In an implementation, the chip power supply system includes a plurality of the inductor modules, the output capacitor includes a first capacitor, the first capacitor is coupled to the bottom layer of the first PCB, and the first capacitor is connected to the chip through at least two of the N vias of the first PCB and is connected to the plurality of inductor modules through a power layer and a ground layer of the first PCB. In this implementation, the plurality of inductor modules can provide a larger current for the chip, and the first capacitor can make the current transmitted by the inductor module to the chip more stable and smooth.

In an implementation, the output capacitor further includes a second capacitor, the second capacitor is connected to the plurality of inductor modules through a power layer and a ground layer of the first PCB, and the second capacitor is coupled to the first PCB and is located on a periphery of the chip. In this implementation, the added second capacitor can make the current transmitted by the inductor module to the chip more stable. In addition, because the second capacitor is arranged on the periphery of the chip, the second capacitor does not occupy a range in which the power supply contacts of the chip are located, and therefore the current provided to the chip does not decrease.

In an implementation, the output capacitor further includes a second capacitor, the second capacitor is embedded into the first PCB, and is connected to the plurality of inductor modules through a power layer and a ground layer of the first PCB. In this implementation, the added second capacitor can make the current transmitted by the inductor module to the chip more stable. In addition, because the second capacitor is arranged inside the PCB, the second capacitor does not occupy a range in which the power supply contacts of the chip are located, and therefore the current provided to the chip does not decrease.

In an implementation, the chip power supply system further includes a second PCB, the second PCB includes N vias, the N vias of the second PCB correspond to the N vias of the first PCB, and the second PCB is electrically connected to the first PCB through the N vias of the second PCB. The inductor module is connected to the second ends of the M vias of the N vias of the first PCB through the M power supply contacts and M vias of the N vias of the second PCB, and is connected to the chip through the M vias of the first PCB. In this implementation, the inductor module is electrically connected to the chip through the second PCB and the first PCB, so that the chip power supply system in this application is implemented more flexibly.

In an implementation, the chip power supply system includes a plurality of the inductor modules; the output capacitor includes a first capacitor and a second capacitor; the first capacitor is coupled to a bottom layer of the second PCB; the first capacitor is connected to the chip through the vias corresponding to the second PCB and the first PCB; the second capacitor is embedded into the second PCB; and the first capacitor and the second capacitor are connected to the plurality of inductor modules through a power layer and a ground layer of the second PCB. In this implementation, the capacitor is embedded into the second PCB to provide a filtering effect of the chip power supply system, so that a current and voltage transmitted by the inductor module to the chip are more stable.

In an implementation, the chip power supply system includes a plurality of the inductor modules; the output capacitor is coupled to the bottom layer of the second PCB, and is connected to the plurality of inductor modules through a power layer and a ground layer of the second PCB; and the output capacitor is located on a periphery of the chip. In this implementation, the output capacitor is arranged on the periphery of the chip, and does not occupy a range in which the power supply contacts of the chip are located, and therefore the current provided to the chip does not decrease.

In an implementation, the second PCB is electrically connected to the first PCB through a connector; or the second PCB is electrically connected to the first PCB through a contact of the second PCB. It can be learned that this application provides a plurality of connection manners between the second PCB and the first PCB, so that the chip power supply system in this application is designed more flexibly.

A second aspect of this application provides a chip. The chip includes an integrated circuit and a package for encapsulating the integrated circuit. The package includes a top surface and a bottom surface. A specified area of the bottom surface is provided with a plurality of power supply contacts, the plurality of power supply contacts include a plurality of power contacts and a plurality of ground contacts, the plurality of power contacts and the plurality of ground contacts are arranged in zones, so that all power supply contacts in each zone in the specified area are power supply contacts of the same type. The power contacts and the ground contacts of the chip provided in this embodiment are arranged in zones, facilitating vertical connection between the inductor module and the chip.

In an implementation, the power supply contacts in the specified area of the chip are arranged in zones as a power network or a ground network. To be specific, the power network in the integrated circuit in the chip is connected to the power contacts of the chip, and the ground network in the integrated circuit is connected to the ground contacts of the chip. In this implementation, the chip easily receives the current transmitted by the inductor module vertically located below the chip.

In an implementation, the specified area is a central area, a corner area, or a peripheral area of the bottom surface, and the power supply contacts in the specified area are arranged as one of the following arrays: a rectangular array, a square array, a diamond array, a triangular array, a hexagonal array, and a circular array. It can be learned that, in this embodiment, power supply contacts in a specific area of the chip can be flexibly arranged in a plurality of forms.

A third aspect of this application provides a printed circuit board PCB. The PCB includes a top layer, a bottom layer, and N vias. First ends of the N vias are arranged in a first area of the top layer, and the first area is used to connect power supply contacts of a chip; the N vias include a plurality of power vias and a plurality of ground vias, and the plurality of power vias and the plurality of ground vias are arranged in zones, so that all vias in each zone in the first area are vias of the same type. The PCB in this embodiment can deploy power vias and ground vias in zones, avoiding interference caused by interleaving the power vias and the ground vias.

In an implementation, second ends of the N vias are arranged in a second area of the bottom layer of the PCB, and the second area corresponds to the first area and is used to connect an inductor module. In the PCB in this implementation, the inductor module can be arranged below the chip through the N vias, so that a path for the inductor module to supply power to the chip is the shortest.

In an implementation, the vias in the first area and the second area are arranged as one of the following arrays: a rectangular array, a square array, a diamond array, a triangular array, a hexagonal array, and a circular array.

In an implementation, an output capacitor is embedded into the PCB, one end of the output capacitor is connected to one power via of the N vias, and the other end is connected to one ground via of the N vias. In this embodiment, the capacitor is embedded into the PCB, so that a current provided by the inductor module to the chip can be more stable.

A fourth aspect of this application provides a computer device. The computer device includes the chip power supply system according to the first aspect, the chip according to the second aspect, or the PCB according to the third aspect.

The implementations of the first to the fourth aspects in this application can be combined with each other provided that there is no conflict, to achieve a corresponding technical effect.

BRIEF DESCRIPTION OF DRAWINGS

To describe the technical solutions in the embodiments of this application more clearly, the following briefly introduces the accompanying drawings for describing the embodiments. Apparently, the accompanying drawings in the following description show merely some embodiments of this application, and a person of ordinary skill in the art may still derive other drawings from these accompanying drawings without creative efforts.

DESCRIPTION OF EMBODIMENTS

An integrated circuit (integrated circuit, IC) is a microstructure that has required circuit functions and that is formed by interconnecting elements such as transistors, resistors, capacitors, and inductors required in a circuit and wiring by using a specific process, and by deploying the elements on one or more semiconductor wafers or dielectric substrates. The integrated circuit may include a processor, a microprocessor, a packaged microprocessor, a controller, a controller hub, a field-programmable gate array (field-programmable gate array, FPGA), a programmable logic array (programmable logic array, PLA), a microcontroller, an advanced programmable interrupt controller (advanced programmable interrupt controller, APIC), or another semiconductor or electronic component.

In this application, the structure formed after the integrated circuit is packaged is referred to as a chip. The bottom surface of the chip is usually provided with a plurality of contacts as input/output ends. The contact may be any one of a pad, a pin, a protrusion, a ball, or a contact part for transmitting a signal or current. Due to its advantages of a small size, a light weight, few lead-out wires and solder joints, and the like, the chip has become a basic component of an electronic device. A chip used in a network device and a computing device generally has a larger size and requires a larger current due to a higher performance requirement.

Figure 1A:
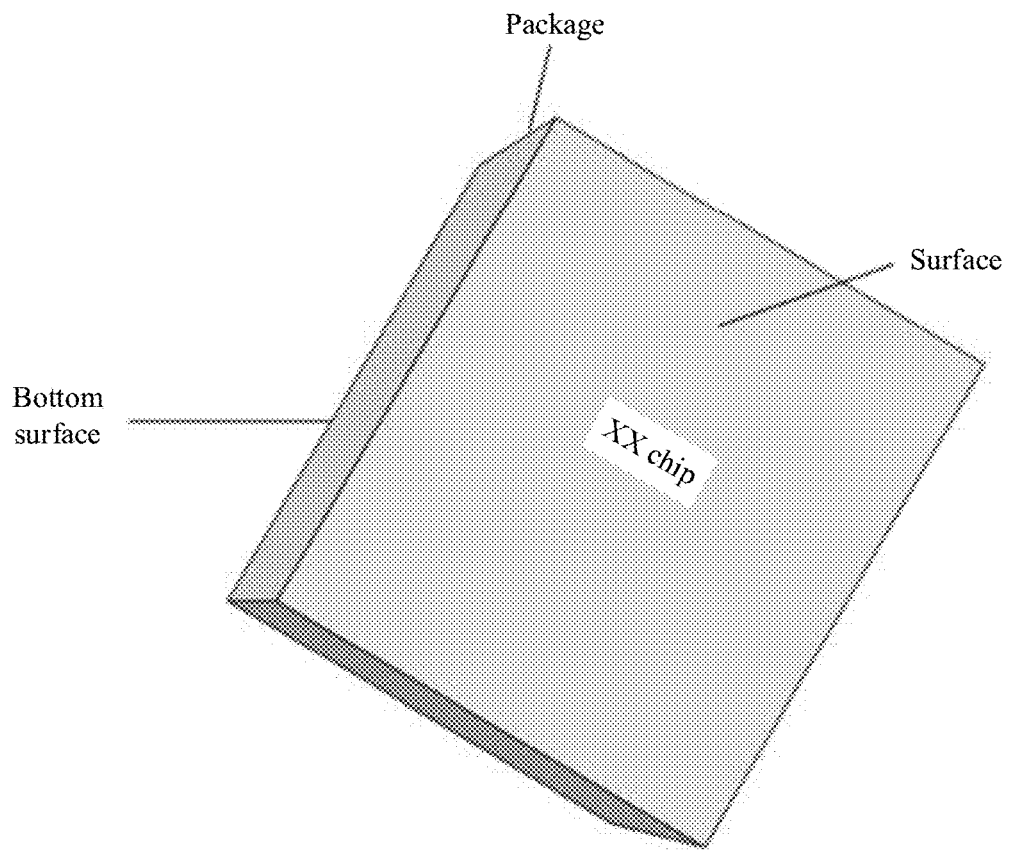
FIG. 1A is a three-dimensional schematic diagram of a chip.
Figure 1B:
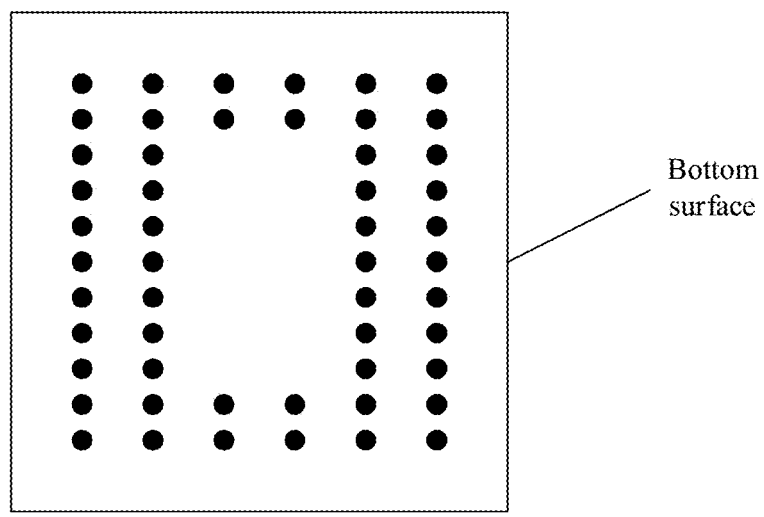
FIG. 1B and FIG. 1C are schematic diagrams of possible bottom surfaces of the chip shown in FIG. 1A.
Figure 1C:
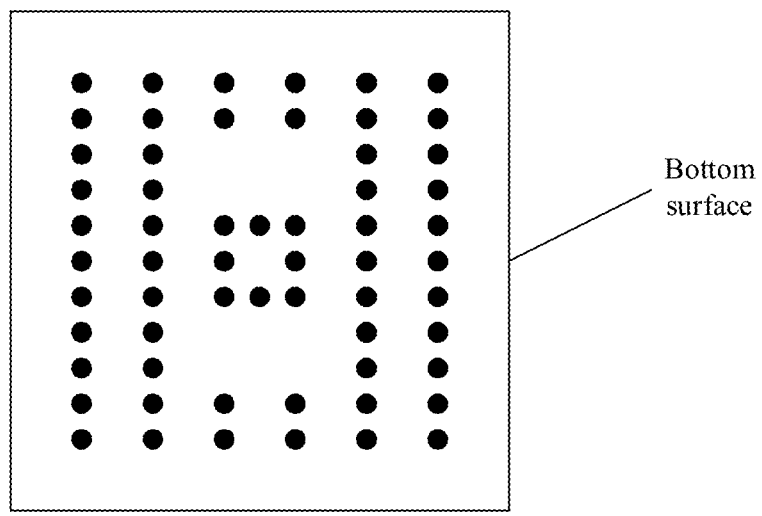

FIG. 1A is a schematic diagram of an appearance of a chip. An integrated circuit of the chip is encapsulated in a package (package), and the package includes a top surface and a bottom surface. The top surface of the package is usually printed with information such as a brand, a name, and a model of the chip. The chip uses a ball grid array (ball grid array) packaging technology, and array solder balls (ball contacts) are deployed at the bottom of the chip as input/output ends of the circuit. These ball contacts connect the circuit inside the chip to another component. For example, FIG. 1B and FIG. 1C are schematic diagrams of different distribution of ball contacts on the bottom surface of the chip. Some of these ball contacts are used to transmit signals, and some are used to transmit currents. A function of each ball contact varies from chip to chip. In this application, a contact for transmitting a signal is referred to as a signal contact, and a contact for transmitting a current is referred to as a power supply contact. Further, a power supply contact for receiving a current transmitted by the chip is referred to as a ground contact, and a contact for transmitting a current to the chip is referred to as a power contact. Usually, the chip is connected to another chip or component and transmits a signal through a printed circuit board (printed circuit board, PCB). In addition, the chip obtains a current required for working through the PCB. The PCB is a support for an electronic element, and is also a carrier for electrical connection of the electronic element. A current mainstream PCB is a multilayer PCB formed by alternately bonding a plurality of PCB layers through a positioning system and an insulating material, and by interconnecting conductive patterns based on a design requirement (the PCB mentioned later in this application is a multilayer PCB). To be specific, each PCB includes a plurality of PCB layers, and two PCB layers are separated by an insulating layer. A top PCB layer and/or a bottom PCB layer are/is provided with contacts for soldering electronic elements. Each PCB layer other than the insulating layer is provided with printed lines (copper tracks) for transmitting signals or currents. The PCB is provided with various vias for connecting different PCB layers. Blind vias are located on the top surface and the bottom surface of the printed circuit board and have a specific depth. The blind vias are used for connection between surface (top or bottom) lines and inner lines. The depth of the via usually does not exceed a specific ratio (aperture). A buried via is a connection hole located at an inner layer of the printed circuit board. The buried via does not extend to the top surface of the circuit board.

Figure 2:
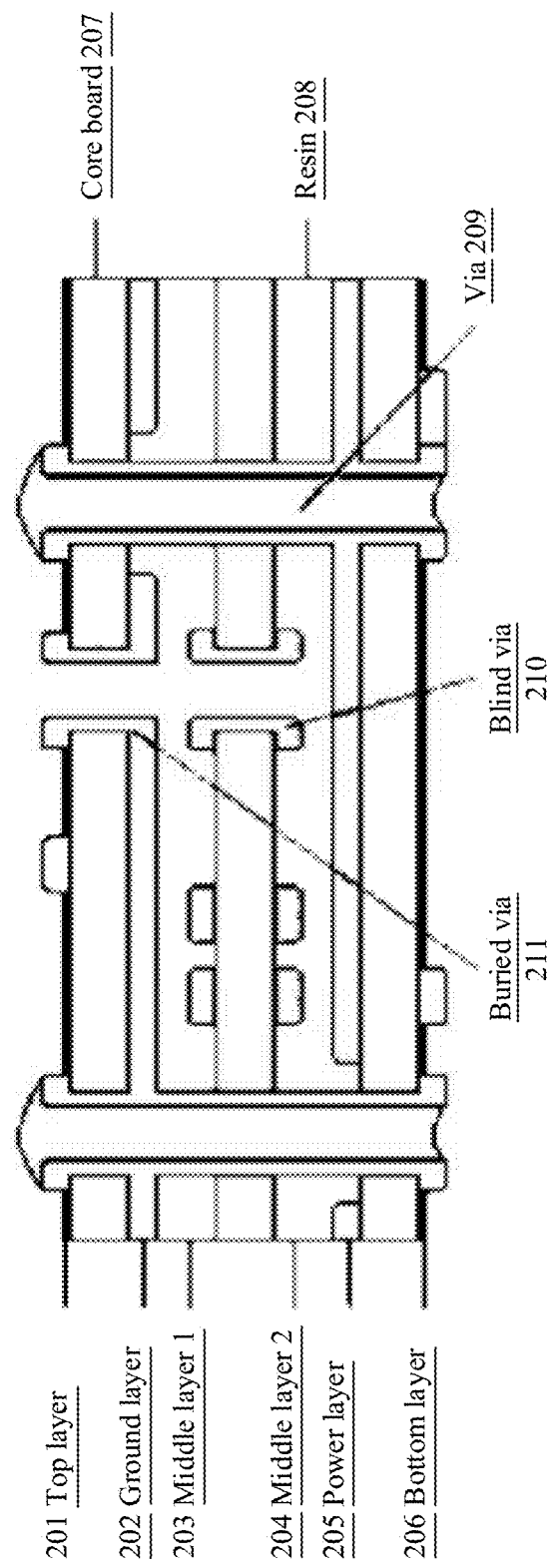
FIG. 2 is a schematic cross-sectional diagram of a PCB.

FIG. 2 is a schematic cross-sectional diagram of a PCB. It can be seen that the PCB includes six PCB layers 201-206 (a top layer, a ground layer, a middle layer 1, a middle layer 2, a power layer, and a bottom layer), two PCB layers are attached to one core board, and different core boards are bonded together by resin. In FIG. 2, a via 209 can connect all six PCB layers, a blind via 210 can connect the PCB layers 203 and 204, and a buried via can connect the PCB layers 201-204. An order of various PCB layers in the PCB and content (a current or a signal) transmitted each time can be designed as needed.

Generally, the PCB supplies power to various electronic elements (including chips) connected to the PCB through the power layer, so that a system that includes the plurality of electronic elements can work. FIG. 3 is a schematic structural diagram of a power supply system when power is supplied to the chip through the PCB. A power controller 301 and n power modules 302*a* to 302*n* (collectively referred to as a power module 302) are connected (plugged or soldered) to a PCB 300. The power controller 301 is configured to control each metal-oxide semiconductor (metal-oxide semiconductor. MOS) transistor in each power module 302 to be turned on or off. An amplitude of an output voltage of the power module 302 is determined by adjusting a duty cycle of turn-on time of each MOS transistor. Voltages output by the plurality of power modules 302 are transmitted to the power layer 303 (gray blocks in the figure) of the PCB 300, and are used to supply power to the chip 304 connected to the power layer 303. The chip 304 is connected to the power layer 303 through the power supply contacts shown in FIG. 1B or FIG. 1C. The power controller 301, the n power modules 302*a*-302*n*, and the chip 304 are all connected to the same surface (that is, the top layer) of the PCB 300.

Figure 3A:
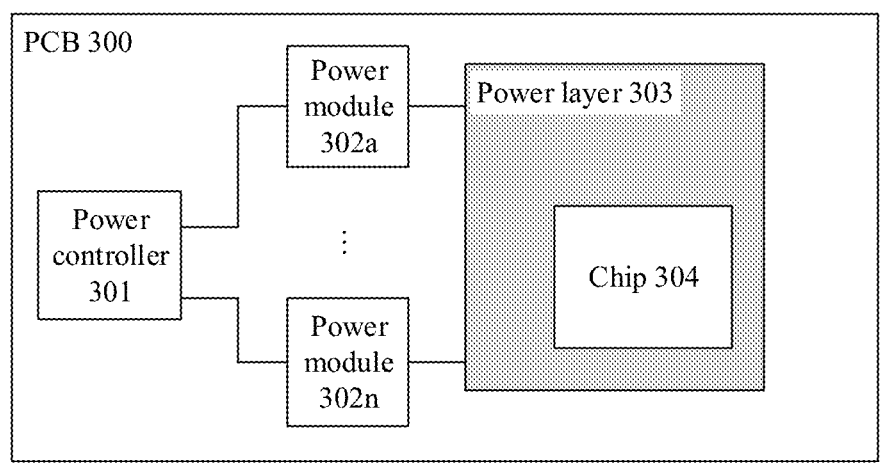
FIG. 3A is a schematic structural diagram of a chip power supply system according to an embodiment of this application.
Figure 3B:
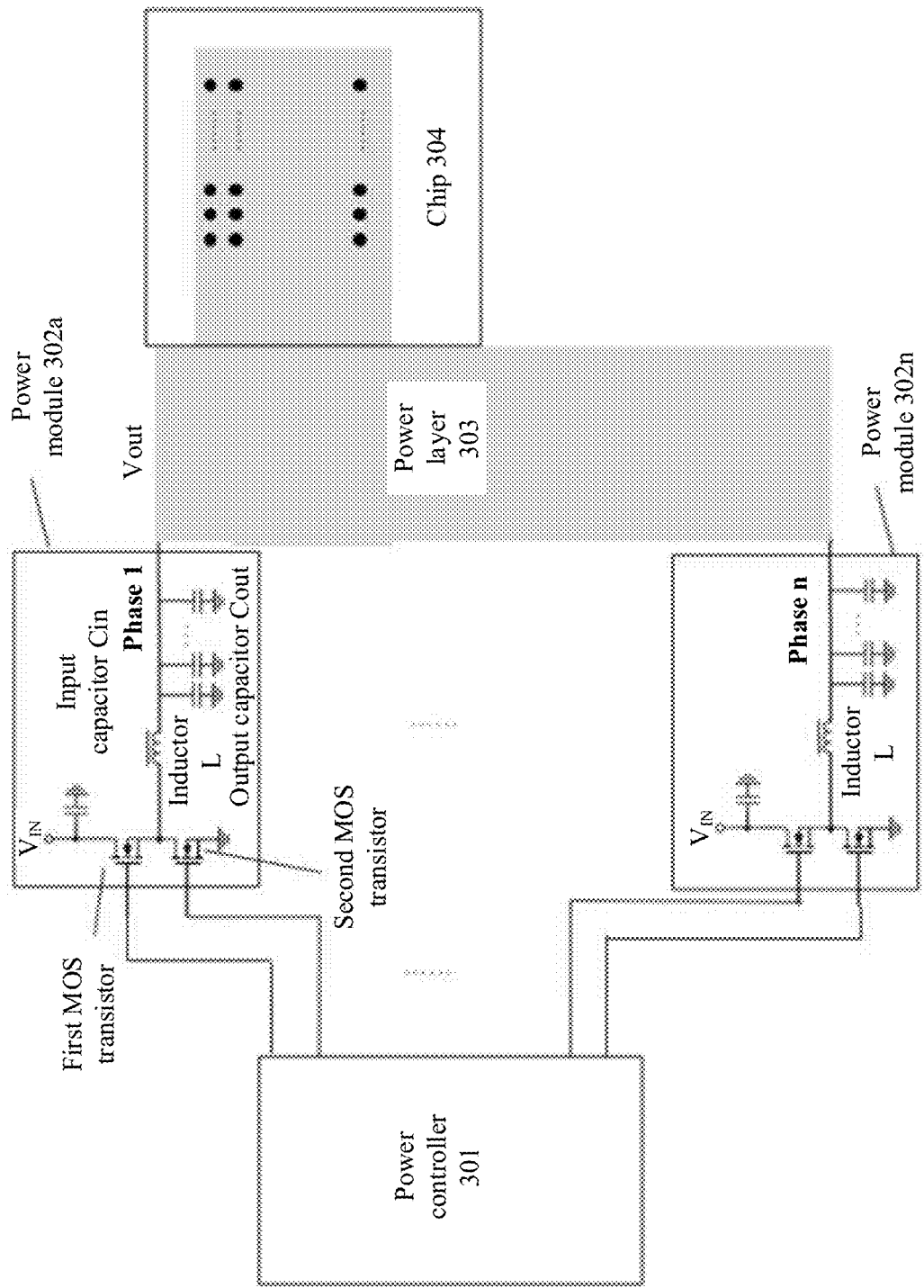
FIG. 3B is a schematic diagram of a power supply principle of the chip power supply system shown in FIG. 3A.

Further, FIG. 3B is a schematic diagram of a power supply principle of the power supply system shown in FIG. 3A (because the PCB is a carrier for various components and a function of the PCB is equivalent to a wire, the PCB 300 is not shown in FIG. 3B). In FIG. 3B, the power controller 301 is separately connected to each MOS transistor in each power module 302. Each power module 302 includes an input power supply Vin, an input capacitor Cin connected to the input power supply Vin, and two MOS transistors connected in series (which can be externally presented as one integrated MOS component). A drain (D) of a first MOS transistor is connected to the input power supply Vin, a source (S) is connected to a drain of a second MOS transistor, a source of the second MOS transistor is grounded, and gates of the two MOS transistors are separately connected to the power controller 301. A connection point between the first MOS transistor and the second MOS transistor is connected to an inductor L (the inductor L is used for rectification and filtering, and the inductor L stores energy when the first MOS transistor is turned on, and freewheels load when the first MOS transistor is turned off and the second MOS transistor is turned on; in addition, the inductor L and the capacitor can form a filtering system to output a relatively stable voltage and current). The inductor L is connected to at least one output capacitor Cout (used for filtering). An output of each power module 302 is used as a power supply (referred to as a phase) to supply power to the power layer 303. Outputs of the n power modules are connected in parallel to form an output power supply Vout of the power layer 303. The n power modules can form a multi-phase power supply through parallel connection of the outputs, and transmit a current through the power layer 303 to supply power to the chip 304 (a plurality of power modules can be connected in parallel to output a larger current while reducing switching noise of the output power supply). A plurality of power supply contacts for transmitting currents are arranged on the chip 304. When the chip 304 is soldered to the power layer 303 by using these power supply contacts, the chip 304 can obtain a current through the power layer 303.

In the power supply system shown in FIG. 3A and FIG. 3B, because the power module 302 and the chip 304 are connected to the same surface of the PCB, a current output by the power module 302 needs to be transmitted at the power layer 303 for a specific distance before reaching the chip 304. In addition, due to a limitation on a processing technique, a thickness of each PCB layer is only 0.5 oz to 2 oz (that is, a thickness achieved by evenly and flatly applying 0.5 to 2 ounces of copper on an area of one square foot), leading to relatively large direct current impedance Rdc of the power layer. When the chip 304 requires a relatively large current, energy consumption I^2*Rdc on a power supply path of the power layer 303 may exceed heat dissipation and chip power supply specifications. In addition, because the current that each power module 302 can provide is limited, when the chip 304 requires a relatively large current, a plurality of power modules 302 are required to supply power to the chip 304 at the same time. Direct current impedance Rdc from different power modules 302 to the power supply contacts of the chip 304 is different, and therefore currents passing through the power supply contacts are different. A current passing through a power supply contact on the periphery of the chip 304 is much larger than a current passing through a power supply contact inside the chip 304. Consequently, the current passing through the power supply contact on the periphery may exceed a limit that can be withstood by the power supply contact, causing damage to the chip 304.

Based on the foregoing considerations, this application provides another chip power supply system, so as to shorten a current transmission path when power is supplied to a chip through a PCB, and avoid a chip damage caused by inconsistent currents passing through ball contacts on the chip.

Figure 4A:
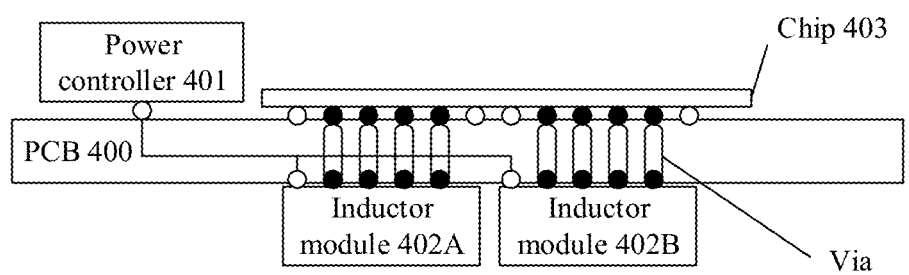
FIG. 4A is a schematic structural diagram of another chip power supply system according to an embodiment of this application.

FIG. 4A is a schematic structural diagram of another chip power supply system according to this application. The chip power supply system includes a PCB 400, a power controller 401, at least one inductor module 402 (402A and 402B are shown in the figure), and a chip 403. The PCB 400 includes N vias (the N vias are some of all vias included in the PCB 400, and are used to supply power to the chip 403. Unless otherwise specified in subsequent parts of this application, the vias refer to power vias). First ends of the N vias are located at a top layer of the PCB 400, and second ends of the N vias are located at a bottom layer of the PCB 400. Both the first ends and the second ends are made of conductive materials. A bottom surface of the chip 403 is provided with N power supply contacts (in FIG. 4A, solid circles represent power supply contacts, and hollow circles represent contacts serving other purposes. This application is intended only for illustration, and provides no further description). The chip 403 is connected to a top layer of the PCB 400 through the N power supply contacts and the N vias. Each of the at least one inductor module 402 is vertically arranged below the power supply contacts of the chip 403. A bottom surface of each inductor module is provided with M power supply contacts (solid circles in FIG. 4A). Each inductor module is connected to the bottom layer of the PCB 400 through the M power supply contacts of the inductor module and the second ends of M vias of the N vias of the PCB 400. In this application, M is less than or equal to N. Each inductor module 402 includes an MOS transistor and an inductor. Quantities of MOS transistors and inductors in the inductor module 402 may vary according to circuit design. The power controller 401 is connected to each inductor module 402 through the PCB 400. The inductor module 402 is configured to supply power to the chip 403 under control of the power controller 401. A quantity of inductor modules 402 can be adjusted according to power consumption specifications of the chip 403. A sufficient quantity of inductor modules 402 can provide the chip 403 with a large current required by the chip 403 and reduce a power supply loss.

In a possible design, the power controller 401 may be connected to the top layer of the PCB 400. In another possible design, the power controller 401 may be connected to the bottom layer of the PCB 400. FIG. 4A is described by using an example in which the power controller 401 is connected to the top layer of the PCB 400. The power controller 401 is connected to a PCB layer through the contacts at the top layer of the PCB 400, and is connected to the inductor module 402 through the PCB layer. Optionally, the chip power supply system shown in FIG. 4A may further include a plurality of output capacitors, and the plurality of output capacitors can be connected to the inductor module 402 in different manners to filter the voltage output by the inductor module 402.

Figure 4B:
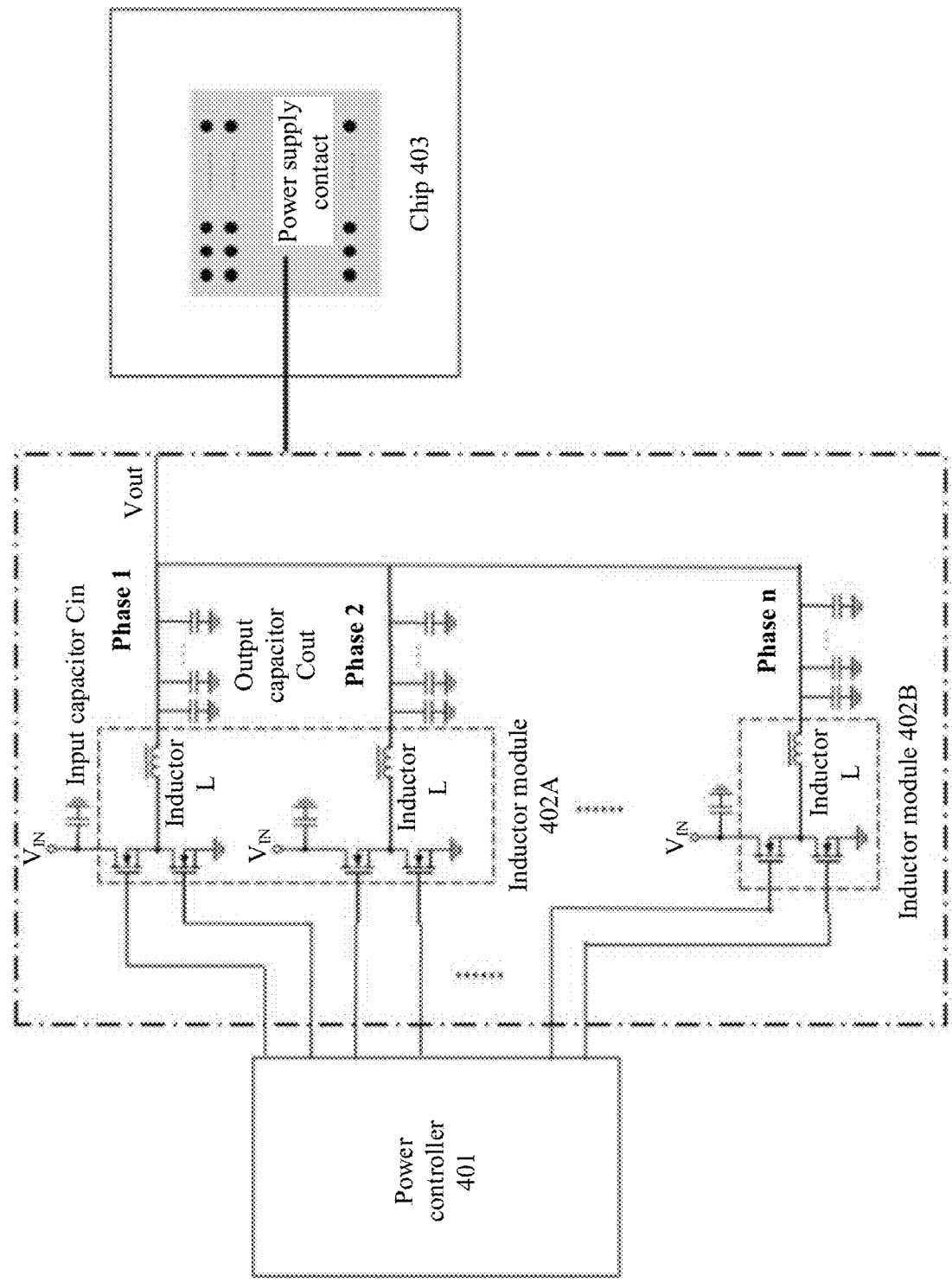
FIG. 4B is a schematic diagram of a power supply principle of the chip power supply system shown in FIG. 4A.

FIG. 4B is a schematic diagram of a power supply principle of the chip power supply system shown in FIG. 4A (because the PCB is a carrier for various components and a function of the PCB is equivalent to a wire, the PCB 400 is not shown in FIG. 4B). In FIG. 4B, the power controller 401 is connected to each MOS transistor in each inductor module 402, and is configured to control each MOS transistor in each inductor module 402 to be turned on or off. An amplitude of an output voltage of the inductor module 402 is determined by adjusting a duty cycle of turn-on time of each MOS transistor. Each inductor module 402 includes one or more submodules (in FIG. 4B, the inductor module 402A includes two submodules, and the inductor module 402B includes one submodule), and each submodule includes at least two MOS transistors connected in series and one inductor L. Different quantities of submodules can provide different currents. In each submodule, a drain (D) of a first MOS transistor is connected to an input power supply Vin, a source (S) is connected to a drain of a second MOS transistor, a source of the second MOS transistor is grounded, and gates of the two MOS transistors are separately connected to the power controller 401. A connection point between the first MOS transistor and the second MOS transistor is connected to the inductor L (the inductor L is used for rectification and filtering, and the inductor L stores energy when the first MOS transistor is turned on, and freewheels load when the first MOS transistor is turned off and the second MOS transistor is turned on; in addition, the inductor L and the capacitor form a filtering system to output a relatively stable voltage and current). A current output by each inductor module 402 is directly transmitted to a corresponding power supply contact of the chip 403 through a power supply contact at the bottom of the inductor module 402 (because there is a large quantity of power supply contacts at the bottom of the inductor module, the power supply contacts are represented by one thick solid line in the figure). Optionally, FIG. 4B may further include a plurality of capacitors, and the plurality of capacitors include an input capacitor Cin and an output capacitor Cout. The input capacitor Cin is configured to filter an input voltage, and input the filtered input voltage into a corresponding inductor module 402. The output capacitor Cout is configured to filter an output voltage of the corresponding inductor module, and input the filtered output voltage into the chip 403.

In the power supply system shown in FIG. 4A and FIG. 4B of this application, the inductor module 402 is directly connected to the chip 403 through N vias of the PCB 400 and supplies power to the chip 403, thereby shortening a power supply path, reducing a power supply path loss, and improving power supply efficiency. Further, in this application, the power layer of the PCB 400 does not need to supply power to the chip 403, thereby reducing a quantity of layers of the PCB 400 and reducing complexity and costs for manufacturing the PCB.

Figure 5A:
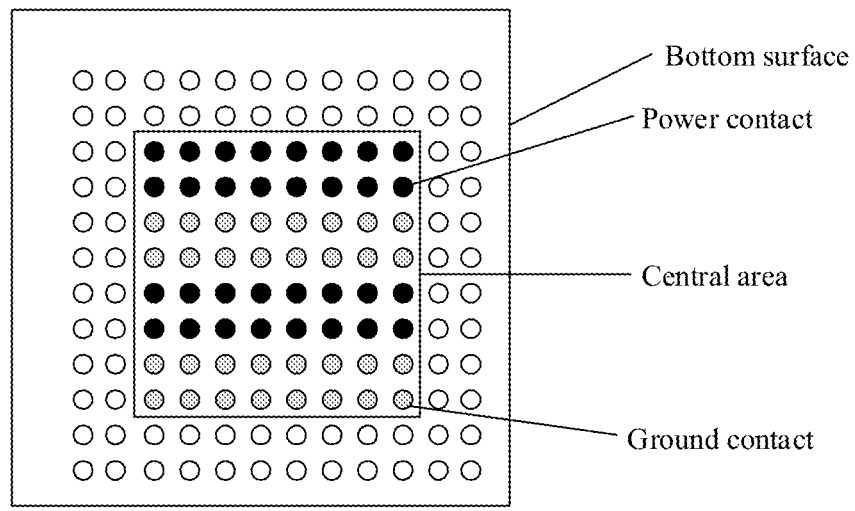
FIG. 5A and FIG. 5B are schematic structural diagrams of chip contacts according to an embodiment of this application.
Figure 5B:
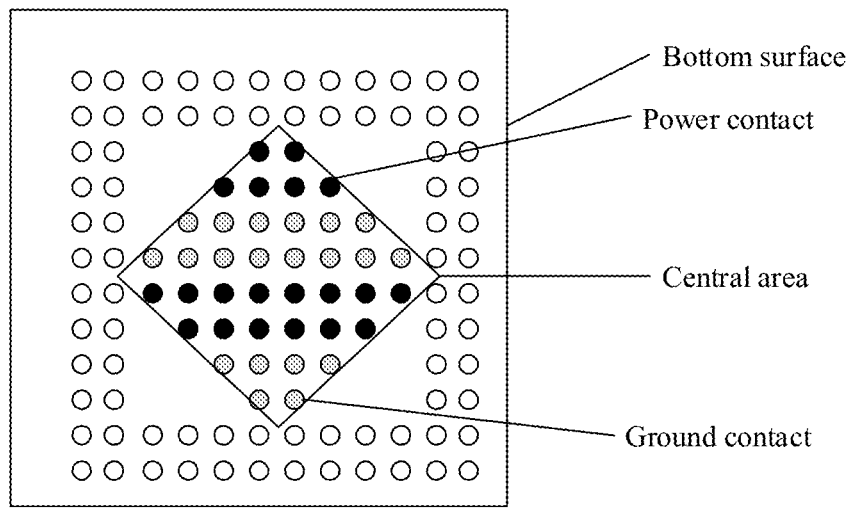

Because the inductor module 402 in FIG. 4A and FIG. 4B is connected to the chip 403 through the vias of the PCB 400, to reduce implementation complexity, this application provides a new chip. The chip includes an integrated circuit and a package, and the package includes a top surface and a bottom surface. As shown in FIG. 5A and FIG. 5B, the bottom surface of the chip provided in this application is provided with a plurality of contacts. Hollow contacts in an edge area of the bottom surface are signal contacts or other functional contacts other than power supply contacts. Contacts in a central area (an area in a small square in FIG. 5A and a diamond area in FIG. 5B) of the bottom surface are power supply contacts. The power supply contacts are categorized into power contacts (black solid circles) and ground contacts (gray solid circles). The power contacts and the ground contacts are arranged in zones, so that in a specified area of the bottom surface, all power supply contacts in each zone (for example, each row or each column serves as one zone, or every several rows or columns serve as one zone) are power supply contacts of the same type. In other words, in the specified area of the bottom surface of the chip, power supply contacts in a specific row or column are either all power contacts or all ground contacts. All power contacts may be arranged in the same zone or different zones, and all ground contacts may also be arranged in the same zone or different zones. In FIG. 5A and FIG. 5B, all power supply contacts are categorized into four zones, where the power contacts are located in two zones and the ground contacts are located in the other two zones.

In FIG. 5A and FIG. 5B, the power supply contacts are arranged in the central area of the bottom surface of the chip. In a possible implementation, the power supply contacts may also be arranged in another specified area of the bottom surface of the chip, for example, an edge or a corner of the bottom surface. The area in which the power supply contacts are located is not limited in this application. The power supply contacts in the specified area are arranged in zones as a power network or a ground network. To be specific, the power supply contacts in a zone are connected to each other through the circuit in the chip to form a power network or a ground network. Specifically, the contacts in the power contact zone form the power network, and the contacts in the ground contact zone form the ground network. Correspondingly, the power network in the integrated circuit in the chip is connected to the power contacts of the chip, and the ground network in the integrated circuit is connected to the ground contacts of the chip. Further, the power supply contacts in the specified area may be arranged as one of the following arrays: a rectangular array, a square array, a diamond array, a triangular array, a hexagonal array, and a circular array.

The chip power supply system shown in FIG. 4A and FIG. 4B in this application can be implemented in different manners. Because the input voltage, the input capacitor, and the power controller 401 can be implemented by using common technologies in this field, the following describes a connection manner between the inductor module 402 and the chip 403 in the chip power supply system shown in FIG. 4A and FIG. 4B with reference to FIG. 6 to FIG. 10. The capacitors in FIG. 6 to FIG. 10 are all output capacitors.

Figure 6:
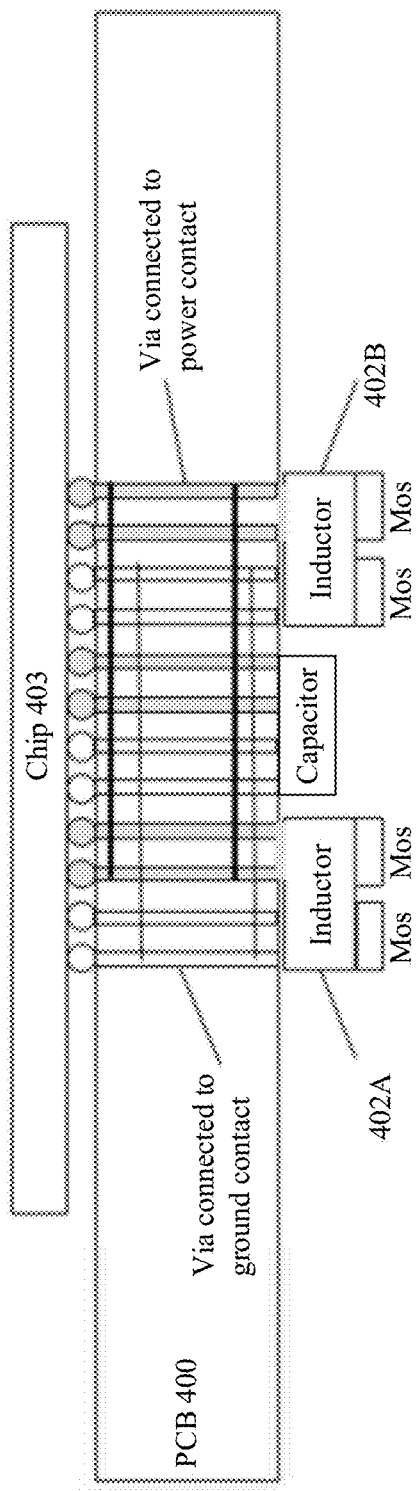
FIG. 6 is a schematic diagram of an implementation of a first chip power supply system according to an embodiment of this application.

FIG. 6 is a schematic diagram of an implementation of a first chip power supply system according to an embodiment of this application. In FIG. 6, two inductor modules 402A and 402B are used to supply power to the chip 403. Each inductor module 402 provides two columns of power contacts and two columns of ground contacts. The power contacts of the inductor module 402 are connected to power contacts of the chip 403 through power vias (gray channels in the figure) of the PCB 400. The ground contacts of the inductor module 402 are connected to ground contacts of the chip 403 through ground vias (hollow channels in the figure) of the PCB 400. All the inductor modules 402 are vertically located below the chip 403 with the PCB 400 in between. All the vias connected to the power contacts are interconnected through the power layer (represented by a thick horizontal line in the figure) of the PCB 400. All the vias connected to the ground contacts are interconnected through the ground layer (represented by a thin horizontal line in the figure) of the PCB 400. The inductor modules 402A and 402B share one (or more) output capacitors (that is, the inductor modules 402A and 402B are connected to the one (or more) output capacitors through lines in the PCB 400). The output capacitor (which may be referred to as a first capacitor) is connected to the bottom layer of the PCB 400, and is configured to filter, through at least two of the N vias of the PCB 400, voltages output by the inductor modules 402A and 402B, and transmit the filtered voltages to the connected chip 403 through the connected vias. Optionally, the output capacitor is located below the chip 403, and the PCB 400 may include a plurality of power layers and a plurality of ground layers. In the system shown in FIG. 6, because a plurality of inductor modules can share one (or more) output capacitors, the costs of the chip power supply system can be reduced.

Figure 7:
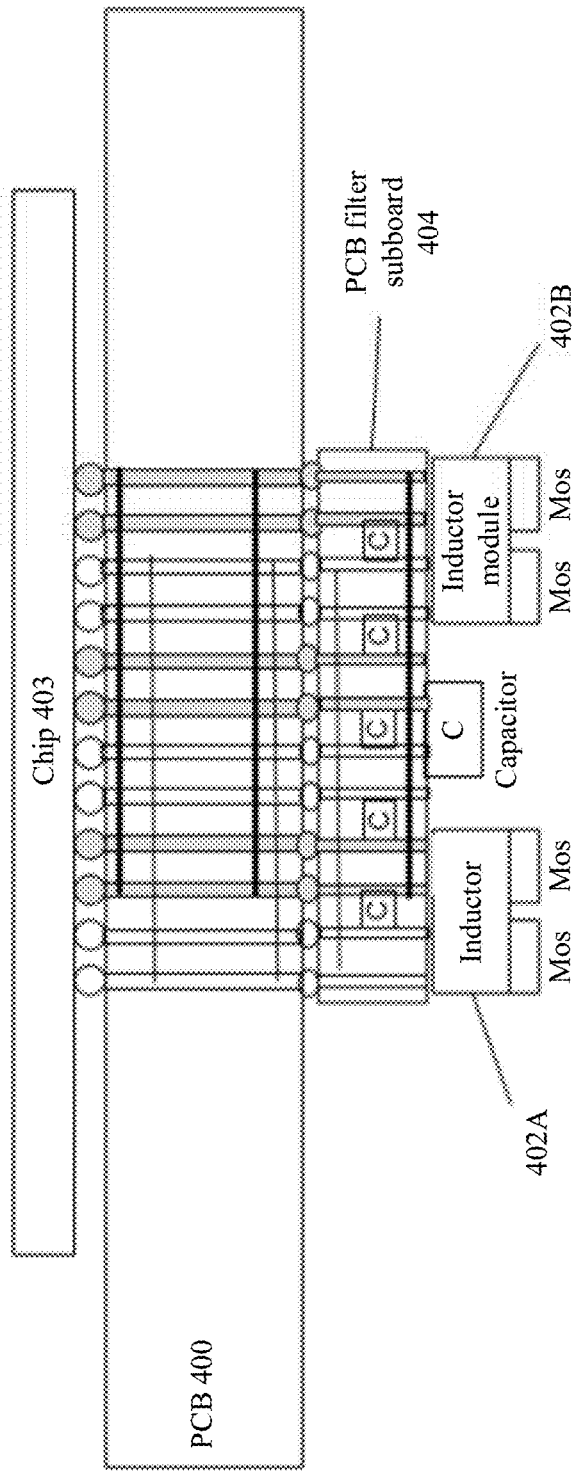
FIG. 7 is a schematic diagram of an implementation of a second chip power supply system according to an embodiment of this application.

FIG. 7 is a schematic diagram of an implementation of a second chip power supply system according to an embodiment of this application. Based on the chip power supply system shown in FIG. 6, the chip power supply system shown in FIG. 7 further includes a PCB filter subboard 404 (when the solution shown in FIG. 7 is used, the PCB 400 may be referred to as a first PCB, and the PCB filter subboard may be referred to as a second PCB in this application). The PCB filter subboard 404 includes N vias, and first ends of the N vias at a top layer of the PCB filter subboard are connected to the second ends of the N vias of the PCB 400. Second ends of the N vias at a bottom layer of the PCB filter subboard are connected to the inductor module 402 and the output capacitor. A plurality of output capacitors are embedded into the PCB filter subboard. One end of each of the plurality of output capacitors is connected to a power via (and then connected to the power layer of the PCB filter subboard 404), and the other end is connected to a ground via (and then connected to the ground layer of the PCB filter subboard 404). It can be learned that, in this implementation, the PCB filter subboard 404 is used as a transmission medium between the inductor module 402 and the chip 403 to improve a filtering effect, so that the voltage and the current output by the inductor module 402 are more stable.

Figure 7A:
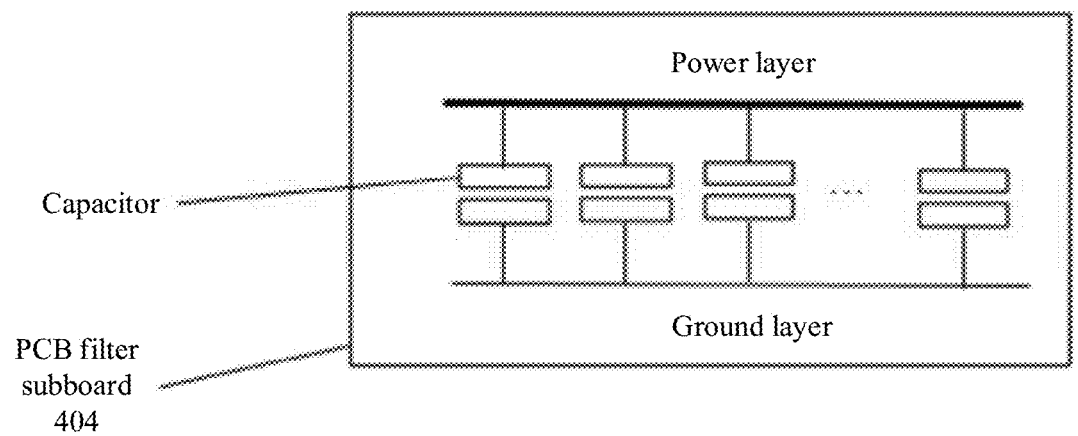
FIG. 7A to FIG. 7C are schematic diagrams of an implementation of a PCB filter subboard 404 in the chip power supply system shown in FIG. 7.

The output capacitor can be deployed in the PCB filter subboard 404 in a plurality of manners. FIG. 7A is a schematic diagram of a connection relationship between the capacitors in the PCB filter subboard 404. In FIG. 7A, one end of each of the plurality of capacitors is connected to the power layer (a thick solid line in the figure) of the PCB filter subboard 404, and the other end is connected to the ground layer (a thin solid line in the figure) of the PCB filter subboard, to form a filter circuit of the plurality of capacitors connected in parallel. The filter circuit can reduce a risk of a power supply short-circuit due to capacitor failure.

Figure 7B:
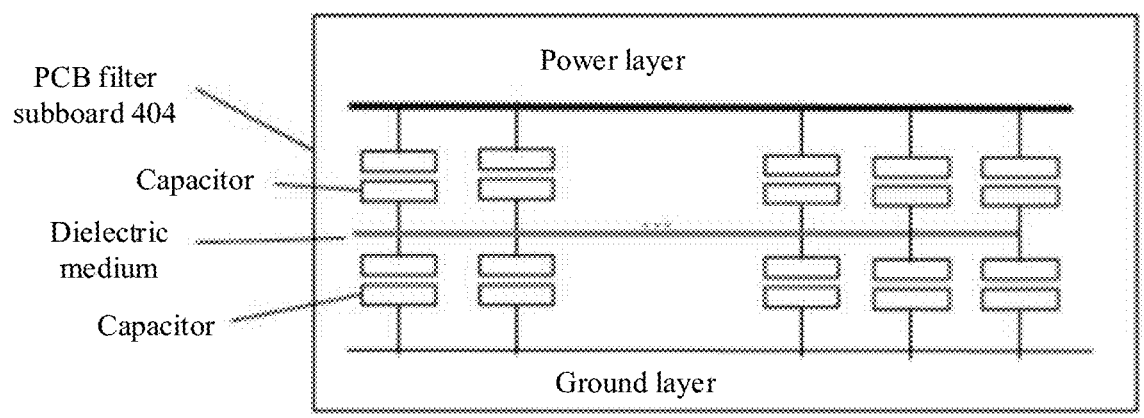

FIG. 7B is a schematic diagram of another connection relationship between the capacitors in the PCB filter subboard 404. In FIG. 7B, two capacitors are connected in series through the conductive layer to form one series capacitor. One end of each of a plurality of series capacitors is connected to the power layer (a thick solid line in the figure) of the PCB filter subboard 404, and the other end is connected to the ground layer (a thin solid line in the figure) of the PCB filter subboard 404, to form a filter circuit of the plurality of series capacitors connected in parallel. The filter circuit can effectively improve reliability of a capacitor application, especially an embedded capacitor application, and reduce a risk of a power supply short-circuit due to capacitor failure.

Figure 7C:
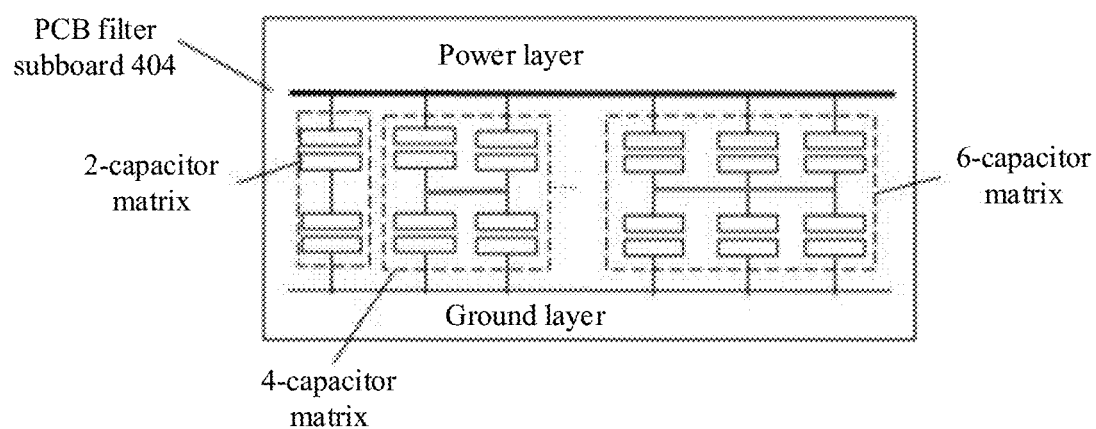

FIG. 7C is a schematic diagram of still another connection relationship between the capacitors in the PCB filter subboard 404. In FIG. 7C, a plurality of capacitors can be interconnected to form a capacitor matrix, and each capacitor matrix includes at least one series capacitor, and the series capacitor is formed by connecting two capacitors in series. One end of the series capacitor in each capacitor matrix is connected to the power layer (a thick solid line in the figure) of the PCB filter subboard 404, and the other end is connected to the ground layer (a thin solid line in the figure) of the PCB filter subboard 404, to form a filter circuit that includes a plurality of capacitor matrices (the figure shows a 2-capacitor matrix, a 4-capacitor matrix, and a 6-capacitor matrix). The filter circuit functions equivalently to the application in FIG. 7B, and can effectively improve reliability of a capacitor application, especially an embedded capacitor application. In addition, in comparison with the solution in FIG. 7B, the filter circuit meets an engineering design application more flexibly.

Using the PCB filter subboard 404 can improve the filtering effect, so that the voltage transmitted to the chip 403 is more stable. Optionally, the capacitors in the PCB filter subboard 404 may also be embedded into the PCB 400, so that the implementation shown in FIG. 7 may not include the PCB filter subboard 404.

Figure 8:
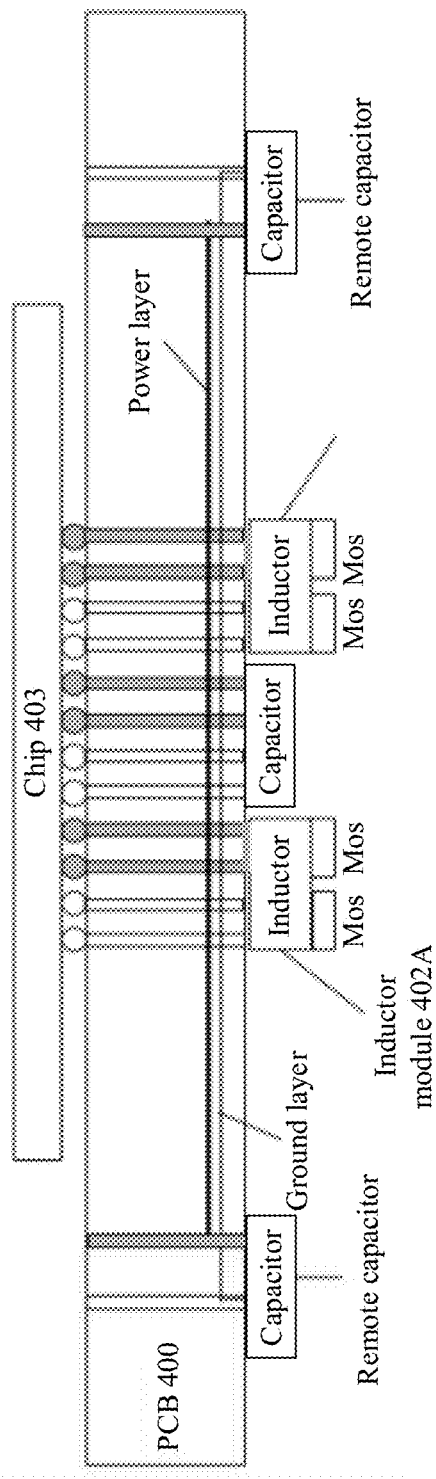
FIG. 8 is a schematic diagram of an implementation of a third chip power supply system according to an embodiment of this application.

FIG. 8 is a schematic diagram of an implementation of a third chip power supply system according to an embodiment of this application. Based on the chip power supply system shown in FIG. 6, the chip power supply system shown in FIG. 8 further includes a plurality of remote capacitors (which may be referred to as second capacitors). The plurality of remote capacitors are connected to the bottom layer of the PCB 400, and are connected to the inductor modules 402A and 402B through the power layer of the PCB 400 to filter the voltages output by the inductor modules 402A and 402B. The plurality of remote capacitors are not located below the chip 403. Deploying remote capacitors at the bottom layer of the PCB 400 can improve stability of voltages output by the inductor modules 402A and 402B.

Figure 9:
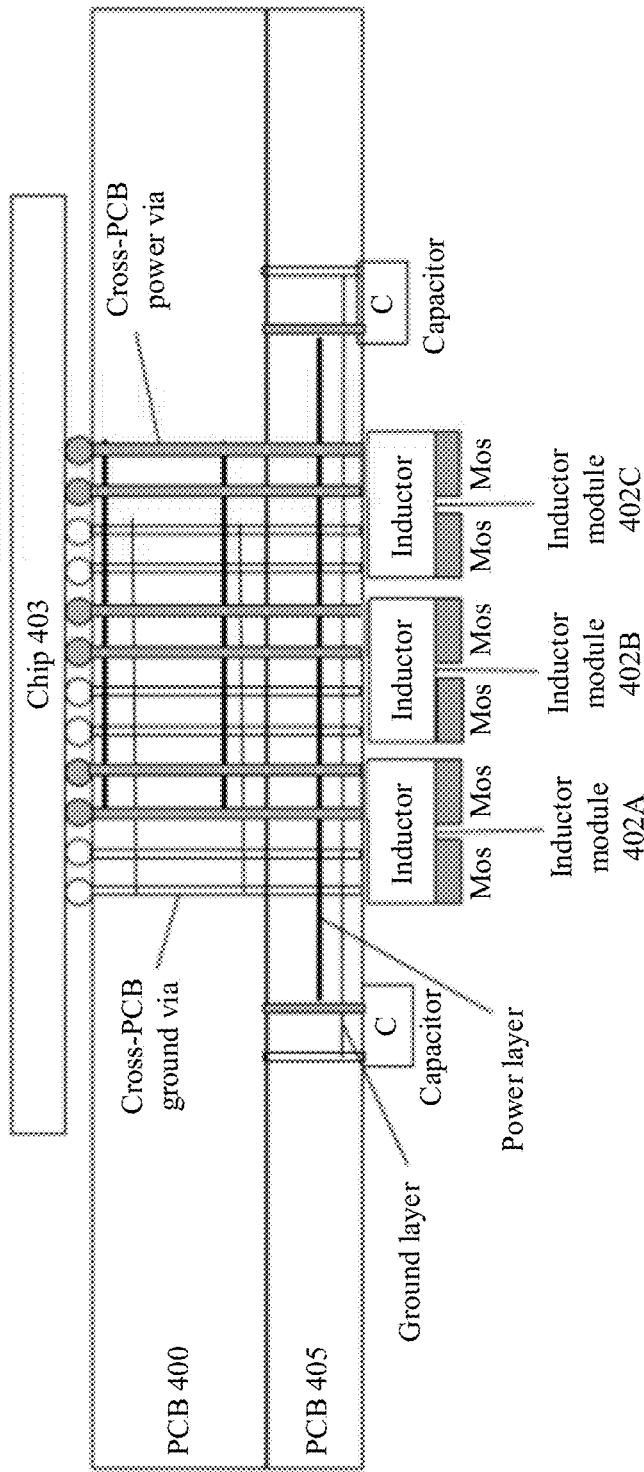
FIG. 9 is a schematic diagram of an implementation of a fourth chip power supply system according to an embodiment of this application.

FIG. 9 is a schematic diagram of an implementation of a third chip power supply system according to an embodiment of this application. In addition to a power controller 401, the chip power supply system further includes a PCB 400 (which may be referred to as a first PCB), a PCB 405 (which may be referred to as a third PCB), a plurality of inductor modules 402 (the figure shows inductor modules 402A, 402B, and 402C), and a chip 403. For the PCB 400, refer to descriptions in other embodiments. The PCB 405 includes N vias corresponding to the PCB 400, and the PCB 405 is coupled to the PCB 400 through the N vias to form N cross-PCB vias, some of which are cross-PCB power vias (gray vias in the figure), and some of which are cross-PCB ground vias (hollow vias in the figure). The chip 403 is connected to a top layer of the PCB 400. The plurality of inductor modules 402 are coupled to a bottom surface of the PCB 405, and are connected to the chip 403 and supply power to the chip 403 through the cross-PCB vias. The plurality of inductor modules 402 are all vertically deployed below the chip 403. The chip power supply system further includes a plurality of output capacitors. The plurality of output capacitors are coupled to the bottom surface of the PCB 405, and are connected to the plurality of inductor modules 402 through the power layer and the power vias of the PCB 405. According to the power supply system shown in FIG. 9, two PCBs are combined to vertically deploy more inductor modules and implement power supply with a larger current. In addition, the filter capacitor can be placed close to the inductor module to achieve a good filtering effect, and provide the chip 403 with a stable power supply voltage.

Figure 10:
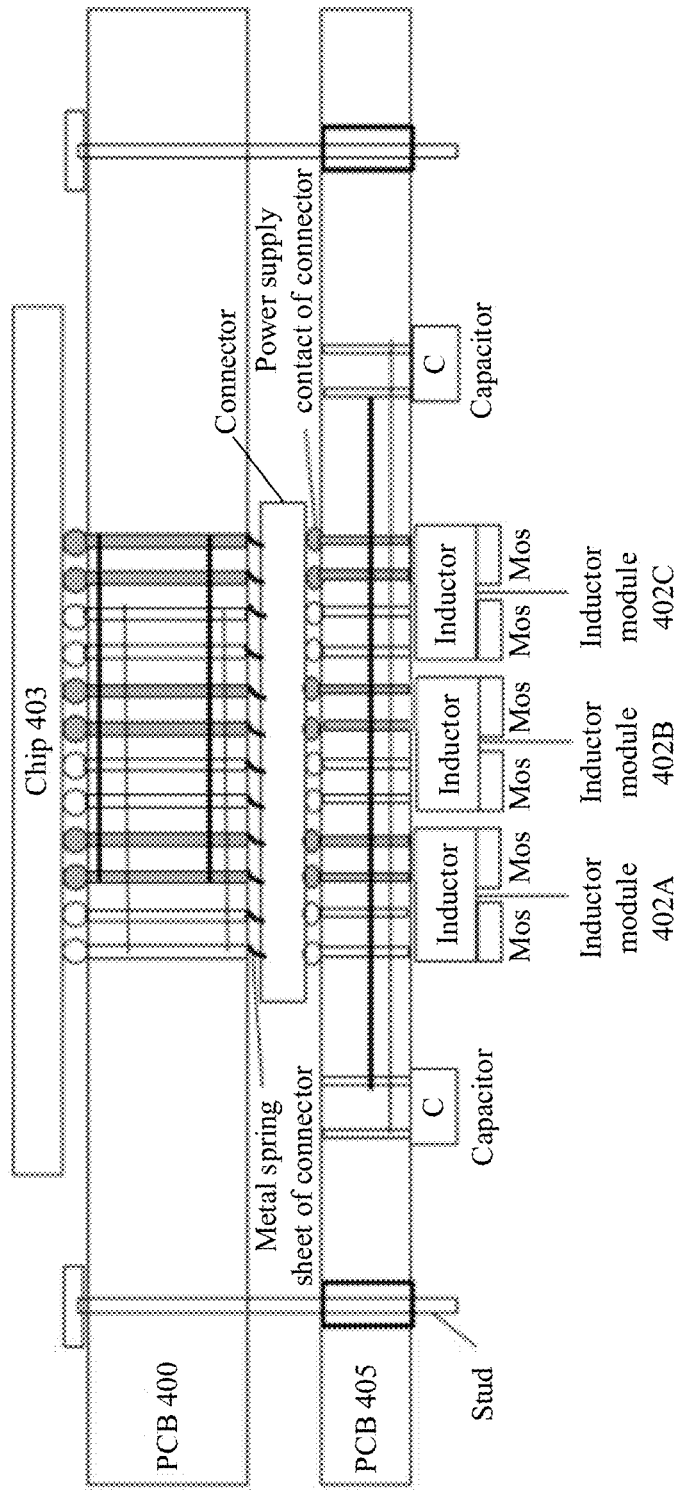
FIG. 10 is a schematic diagram of an implementation of a fifth chip power supply system according to an embodiment of this application.

Based on the chip power supply system shown in FIG. 9, this application further provides a fifth chip power supply system. As shown in FIG. 10, the chip power supply system further includes a connector for connecting the PCB 400 and the PCB 405. One end of the connector is provided with N metal spring sheets, and the other end is provided with N power supply contacts. The N metal spring sheets are connected to the power supply contacts of the N vias of the PCB 400 at the bottom layer. The N power supply contacts are connected to the power supply contacts of the N vias of the PCB 405 at the top layer. Because the PCB 400 and the PCB 405 are connected by using the connector, to stabilize the connection between the PCB 400 and the PCB 405, another fastener (a stud is shown in FIG. 10) may be further used to connect the PCB 400 and the PCB 405. The connector implements a flexible connection between the PCB 400 and the PCB 405, and achieves an effect equivalent to the power supply system in FIG. 9.

The foregoing various implementations show the chip power supply system provided in this application. Although the various implementations are slightly different, they belong to the same inventive concept and can be referred to each other, that is, for parts that are not described in detail in one implementation, reference can be made to the descriptions in other implementations.

Further, to increase a service life of the chip, the chip power supply system provided in various embodiments of this application may further include a heat sink. The heat sink is coupled to the top surface of the chip to dissipate heat for the chip.

To achieve the purpose of supplying power to the chip, this application further provides a PCB. The PCB includes a top layer, a bottom layer, and N vias. First ends of the N vias are arranged in a first area of the top layer of the PCB, and the first area is used to connect power supply contacts of a chip. The N vias include a plurality of power vias and a plurality of ground vias, and the plurality of power vias and the plurality of ground vias are arranged in zones, so that all vias in each zone in the first area are vias of the same type. To be specific, vias in each row or each column in the first area are either all ground vias or all power vias. For zones in the PCB, refer to the descriptions of FIG. 5A and FIG. 5B.

In an implementation, second ends of the N vias are arranged in a second area of the bottom layer of the PCB, and the second area corresponds to the first area and is used to connect an inductor module. Specifically, the second area is located below the first area.

The vias in the first area and the second area are arranged as one of the following arrays: a rectangular array, a square array, a diamond array, a triangular array, a hexagonal array, and a circular array. Shapes of the first area and the second area are the same as the shapes of the area for arranging power supply contacts on the bottom surface of the chip shown in FIG. 5.

In another implementation, some of the N vias are connected to the inductor module, and some other vias are connected to a first-type output capacitor.

Optionally, an output capacitor is embedded into the PCB, one end of the output capacitor is connected to one power via of the N power vias, and the other end is connected to one ground via of the N power vias.

According to the chip power supply system provided in this application, a power supply path of the chip can be shortened, greatly reducing energy consumption on the power supply path. In addition, according to the chip power supply system in this application, the inductor module does not need to supply power to the chip from a periphery of the chip through the PCB, reducing a quantity of layers of the PCB and reducing production costs of the PCB. In addition, because the inductor module transmits a voltage to the chip through the vias, and the vias have the same length, impedance reaching all power contacts of the chip is basically the same, thereby resolving a problem of overcurrents at some power contacts of the chip.

Further, this application further provides a computer device. The computer device includes the chip power supply system, the chip, or the PCB provided in this application. The computer device may be a terminal, for example, a personal computer, a mobile phone, a palmtop computer, a wearable electronic device, or a vehicle-mounted device. The computer device may also be a network device, for example, a switch, a router, a firewall, a base station, a wireless access point, or a wireless controller. The computer device may also be a storage device, for example, a storage server, or a storage array. The computer device may also be a device that provides high-performance computing. The implementations in this application can be combined with each other provided that there is no conflict, to achieve a corresponding technical effect.

The foregoing descriptions are merely preferred implementations of this application. It should be noted that a person of ordinary skill in the art may make several improvements or polishing without departing from the principle of this application and the improvements or polishing shall fall within the protection scope of this application.

What is claimed is:

1. A chip power supply system, comprising:
   a first printed circuit board (PCB);
   a chip;
   a power controller; and
   an inductor module, wherein
   the first PCB comprises N vias, first ends of the N vias are located at a top layer of the first PCB, and second ends of the N vias are located at a bottom layer of the first PCB, and N is an integer that is greater than 1;
   a bottom surface of the chip is provided with N power supply contacts, and the chip is coupled to the top layer of the first PCB through the N power supply contacts and the first ends of the N vias;
   a bottom surface of the inductor module is provided with M power supply contacts, and the inductor module is coupled to the chip through the M power supply contacts and the second ends of M vias, wherein the M vias are part of the N vias, and M is equal to or less than N, and
   the power controller is coupled to the inductor module through the first PCB, wherein the power controller is configured to control the inductor module to supply power to the chip.

2. The chip power supply system according to claim 1, further comprising:
   an input capacitor; and
   an output capacitor,
   wherein the input capacitor is configured to filter an input voltage, and input the filtered input voltage into the inductor module, and wherein the output capacitor is configured to filter an output voltage, and input the filtered output voltage into the chip.

3. The chip power supply system according to claim 2, wherein
   the inductor module is coupled to a bottom surface of the first PCB through the M power supply contacts and the second ends of the M vias of the N vias, and coupled to the chip through the M vias.

4. The chip power supply system according to claim 2, wherein the chip power supply system comprises a plurality of the inductor modules,
   wherein the output capacitor comprises a first capacitor that is coupled to the bottom layer of the first PCB, and the first capacitor is coupled to the chip through at least two of the N vias of the first PCB and is coupled to the plurality of inductor modules through a power layer and a ground layer of the first PCB.

5. The chip power supply system according to claim 4, wherein the output capacitor further comprises a second capacitor, the second capacitor is coupled to the plurality of inductor modules through a power layer and a ground layer of the first PCB, and the second capacitor is coupled to the first PCB and is located on a periphery of the chip.

6. The chip power supply system according to claim 4, wherein the output capacitor further comprises a second capacitor, the second capacitor is embedded into the first PCB, and is coupled to the plurality of inductor modules through a power layer and a ground layer of the first PCB.

7. The chip power supply system according to claim 2, wherein the chip power supply system further comprises a second PCB, the second PCB comprises N vias, the N vias of the second PCB correspond to the N vias of the first PCB, and the second PCB is electrically coupled to the first PCB through the N vias of the second PCB, and wherein the inductor module is coupled to the second ends of the M vias of the N vias of the first PCB through the M power supply contacts and M vias of the N vias of the second PCB, and is coupled to the chip through the M vias of the first PCB.

8. The chip power supply system according to claim 7, wherein the chip power supply system comprises a plurality of the inductor modules,
wherein the output capacitor comprises a first capacitor and a second capacitor, the first capacitor is coupled to a bottom layer of the second PCB, the first capacitor is coupled to the chip through the vias corresponding to the second PCB and the first PCB, the second capacitor is embedded into the second PCB, and the first capacitor and the second capacitor are coupled to the plurality of inductor modules through a power layer and a ground layer of the second PCB.

9. The chip power supply system according to claim 7, wherein the chip power supply system comprises a plurality of the inductor modules,
wherein the output capacitor is coupled to a bottom layer of the second PCB, and is coupled to the plurality of inductor modules through a power layer and a ground layer of the second PCB, and the output capacitor is located on a periphery of the chip.

10. The chip power supply system according to claim 9, wherein
the second PCB is electrically coupled to the first PCB through a connector; or
the second PCB is electrically coupled to the first PCB through a contact of the second PCB.

11. The chip power supply system according to claim 1, wherein the chip comprises:
an integrated circuit; and
a package for encapsulating the integrated circuit,
wherein the package comprises a top surface and a bottom surface, and wherein a specified area of the bottom surface is provided with the N power supply contacts, the plurality of power supply contacts comprise a plurality of power contacts and a plurality of ground contacts, and the plurality of power contacts and the plurality of ground contacts are arranged in zones, so that all power supply contacts in each zone in the specified area are power supply contacts of the same type.

12. The chip power supply system according to claim 11, wherein the power supply contacts in the specified area are arranged in zones as a power network or a ground network.

13. The chip power supply system according to claim 11, wherein the specified area is a central area of the bottom surface, and the power supply contacts in the specified area are arranged as one of the following arrays: a rectangular array, a square array, a diamond array, a triangular array, a hexagonal array, and a circular array.

14. The chip power supply system according to claim 1, wherein the first PCB comprises:
the top layer,
the bottom layer, and
the N vias,
wherein the first ends of the N vias are arranged in a first area of the top layer, and the first area is used to couple power supply contacts of a chip, and
wherein the N vias comprise a plurality of power vias and a plurality of ground vias, and the plurality of power vias and the plurality of ground vias are arranged in zones, so that all vias in each zone in the first area are vias of the same type.

15. The chip power supply system according to claim 14, wherein second ends of the N vias are arranged in a second area of the bottom layer of the PCB, and the second area corresponds to the first area and is used to connect an inductor module.

16. The chip power supply system according to claim 15, wherein the vias in the first area and the second area are arranged as one of the following arrays: a rectangular array, a square array, a diamond array, a triangular array, a hexagonal array, and a circular array.

17. The chip power supply system according to claim 14, wherein an output capacitor is embedded into the PCB, one end of the output capacitor is coupled to one power via of the N vias, and the other end is coupled to one ground via of the N vias.

18. A computer device, comprising:
a chip power supply system, wherein the chip power supply system comprises a first printed circuit board (PCB), a chip, a power controller, and an inductor module, wherein
the first PCB comprises N vias, first ends of the N vias are located at a top layer of the first PCB, and second ends of the N vias are located at a bottom layer of the first PCB, and N is an integer that is greater than 1;
a bottom surface of the chip is provided with N power supply contacts, and the chip is coupled to the top layer of the first PCB through the N power supply contacts and the first ends of the N vias;
a bottom surface of the inductor module is provided with M power supply contacts, and the inductor module is coupled to the chip through the M power supply contacts and the second ends of M vias, wherein the M vias are part of the N vias, and M is equal to or less than N, and
the power controller is coupled to the inductor module through the first PCB, wherein the power controller is configured to control the inductor module to supply power to the chip.

19. The computer device according to claim 18, wherein the N power supply contacts of the chip are located at a specified area of the bottom surface of the chip, and the N power supply contacts comprise a plurality of power contacts and a plurality of ground contacts, and the plurality of power contacts and the plurality of ground contacts are arranged in zones, so that all power supply contacts in each zone in the specified area are power supply contacts of the same type.

20. The computer device according to claim 19, wherein the first ends of the N vias of the first PCB are located in a first area of the top layer of the first PCB, and the first area is used to couple power supply contacts of a chip, and
wherein the N vias comprise a plurality of power vias and a plurality of ground vias, and the plurality of power vias and the plurality of ground vias are arranged in zones, so that all vias in each zone in the first area are vias of the same type.

* * * * *